United States Patent

Nakagomi et al.

[11] Patent Number: 4,495,621
[45] Date of Patent: Jan. 22, 1985

[54] GLITCH DETECTING AND MEASURING APPARATUS

[75] Inventors: Koji Nakagomi, Gyoda; Tetsuo Aoki, Konosu; Takayuki Nakajima, Gyoda, all of Japan

[73] Assignee: Takeda Riker Co. Ltd., Tokyo, Japan

[21] Appl. No.: 450,791

[22] Filed: Dec. 17, 1982

[30] Foreign Application Priority Data

Dec. 21, 1981 [JP] Japan .................. 56-206377

[51] Int. Cl.³ .......................... G01R 31/28
[52] U.S. Cl. ...................... 371/6; 307/234; 328/111; 371/15
[58] Field of Search ............. 371/6, 15, 29; 307/520, 307/234, 352; 328/111, 165

[56] References Cited

U.S. PATENT DOCUMENTS

| 3,386,079 | 5/1968 | Wiggins | 371/6 |
| 3,449,716 | 6/1969 | Brothman et al. | 371/6 |
| 3,909,724 | 9/1975 | Spoth et al. | 371/6 X |
| 4,006,454 | 2/1977 | Beseke et al. | 371/6 |
| 4,107,651 | 8/1978 | Martin | 371/6 |
| 4,293,949 | 10/1981 | Philippides | 371/6 |
| 4,353,032 | 10/1982 | Taylor | 328/111 X |

Primary Examiner—Charles E. Atkinson
Attorney, Agent, or Firm—Staas & Halsey

[57] ABSTRACT

A device for recognizing and measuring the lengths of glitches by sampling the input signal at fractions of a sampling clock, which clock has a period shorter than the period of pulses of the correct signal but longer than the glitch widths. The corrected input signal can be displayed, along with the glitch information.

18 Claims, 17 Drawing Figures

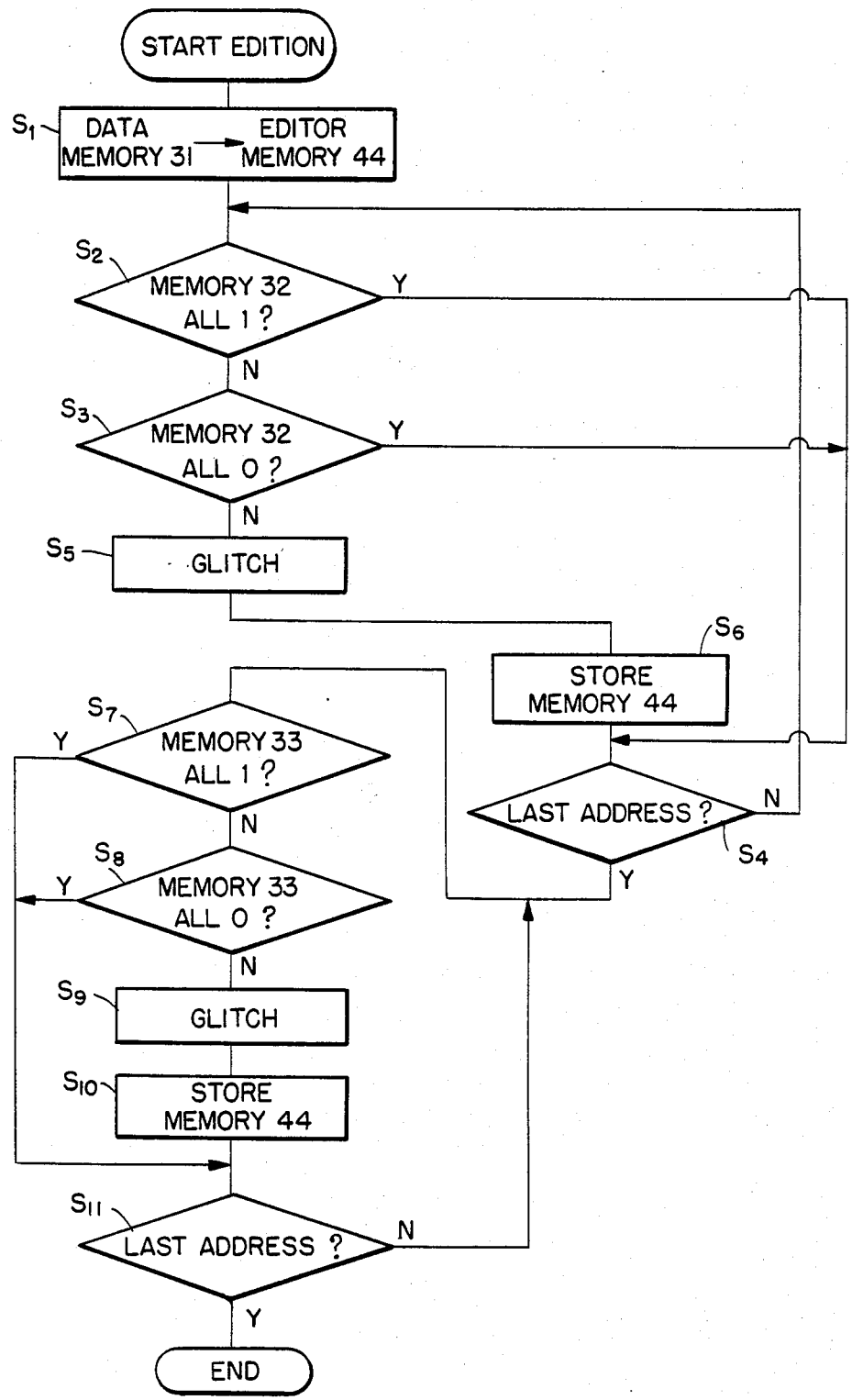

GLITCH DETECTING AND MEASURING APPARATUS

BACKGROUND OF THE INVENTION

This invention relates to a logic analyzer and especially to an apparatus for detection and measurement of unwanted signals commonly referred to as glitches.

A logic analyzer that analyzes the operation of a logic circuit usually contains in it a cathode ray tube (CRT) to display the waveforms which obtain at various points of the logic circuit under test, so as to allow the user to know whether the logic circuit works correctly or not. Such systems are discussed for instance in *Understanding Logic Analyzers*, by Roy Tottingham, in Machine Design, Apr. 12, 1979. In recent logic analyzers a glitch detection circuit is also provided, and from the waveforms shown on the CRT a glitch may be recognized by the user, for instance as described in U.S. Pat. No. 4,107,651.

In such a prior art glitch detection circuit, although it is possible to detect a glitch, it is not possible to measure the width of the glitch. Information on the width of the glitch is useful for finding the cause of the glitch, for knowing the propagation time delay of the circuit and so forth.

A glitch that is superimposed on digital data is usually a very narrow pulse that is sometimes periodic and sometimes not periodic. Thus, measurement of the pulse width of glitches by for example a counter or some other time-interval-measuring instrument is difficult. There is a possibility of measuring a glitch width by using an oscilloscope along with a logic analyzer contained in a glitch detection circuit. When a glitch is detected in a certain position of the data train by the logic analyzer, the user adjusts the oscilloscope to obtain suitable triggering to observe the waveform of the glitch. However, this operation is complicated and difficult. Further, since both a logic analyzer and an oscilloscope are required in this method, it becomes quite expensive.

SUMMARY OF THE INVENTION

It is an object of the present invention to provide a glitch detecting and measuring apparatus which is capable of detecting glitches among digital signals and of measuring the width of the glitches automatically.

It is another object of the present invention to provide a glitch detecting and measuring apparatus which is capable of being constructed as a single piece of equipment for obtaining simple operation and low cost.

It is a further object of the present invention to provide a glitch detecting and measuring apparatus with a high speed operating part that is capable of being made up of passive elements. Thus, the apparatus is reliable and low in cost.

It is a further object of the present invention to provide a glitch detecting and measuring apparatus which is capable of displaying digital data and glitch information simultaneously.

According to this invention, a delay means which has N output terminals and N-bit registers are provided. Each output terminal of the delay means generates a signal delayed for instance by 1/N of a sampling clock period from a signal of the preceding terminal. When an input digital signal is supplied to the delay means, N delayed input digital signals are generated by the delay means, and each signal is latched at the time of a latch command and stored in the registers.

The N-bit data thus stored in the register are examined and, in the case of all the N bits having the same value of either 1 or 0, the input digital signal is accordingly judged to contain no glitch and thus to be correct data; but, if the stored data are neither all 1's nor all 0's the input digital signal is recognized as a glitch. After detecting the glitch, the width of the glitch is measured by counting the number of continuous 1's or 0's in the data. Since the operation of detecting and measuring the glitch is controlled by a CPU, the operation is prompt and accurate, and also it is possible to detect various types of glitches.

The glitch detecting and measuring apparatus according to this invention is preferably incorporated as part of a logic analyzer. In this case an input data is sampled by the sampling clock as well as being provided to the delay means, and the input data is converted to the data to be stored as representing the input data in synchronism with the sampling clock without alteration of the input data pattern. Accordingly, both the input data and the glitch information may be displayed on the CRT simultaneously.

For doing this, there are provided a data memory which stores the input data as sampled by the sampling clock, and glitch memories which the store N-bit data obtained in the register. Since glitches may have both positive and negative polarity, two glitch detectors comprised of delay means and registers, and two glitch memories, may be provided. Also an editor memory which stores the input data and glitch information as combined data is provided.

The input data and the N bit glitch data are stored in the same addresses of the data memory and the glitch memory, respectively. From the data stored in the glitch memory, the input data is judged to either have a glitch or not, and if it is a glitch, the pulse width of the glitch is measured. When the data in the glitch memory is thus acknowledged as a glitch, this information is transferred to the editor memory and stored for instance in the same address corresponding to the input data. After that the stored data in the editor memory is read out and provided to the display. Thus, a simultaneous display of the sampled input data and of the glitch information is accomplished

BRIEF DESCRIPTION OF THE DRAWINGS

FIG. 7 is a flowchart explaining the operation of detecting and measuring glitches performed by the embodiment of FIG. 5.

DETAILED DESCRIPTION OF THE PREFERRED EMBODIMENTS

Figure 1:
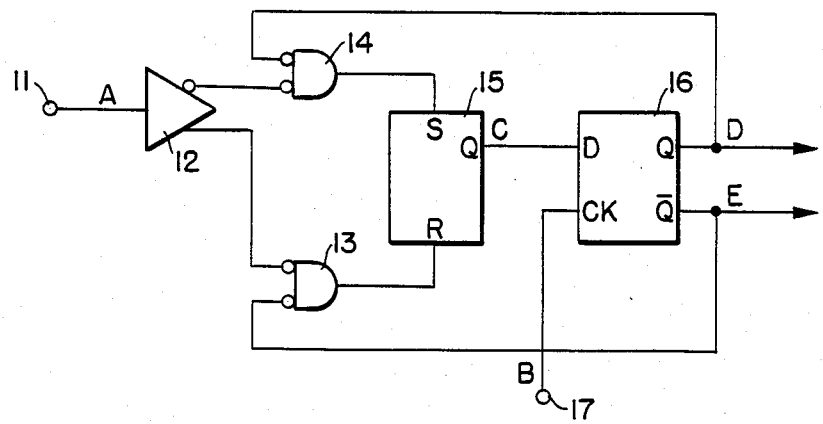
FIG. 1 is a circuit diagram showing one example of the prior art glitch detection circuits.

FIG. 1 shows a conventional glitch detection circuit. An input signal is applied from input terminal 11 to buffer inverter 12 which generates both an identical signal and an inverted signal as outputs. Both output signals from buffer inverter 12 are inverted and supplied to AND gates 13 and 14, respectively. The outputs of AND gates 13 and 14 are connected to the reset and set terminals of flip-flop 15, respectively. The output Q of flip-flop 15 is connected to the data terminal of D-type flip-flop 16 whose clock terminal is provided with a sampling clock signal from terminal 17. The Q and $\overline{Q}$ outputs D,E of flip-flop 16 are connected to AND gates 14 and 13, respectively, after being inverted.

Figure 2:
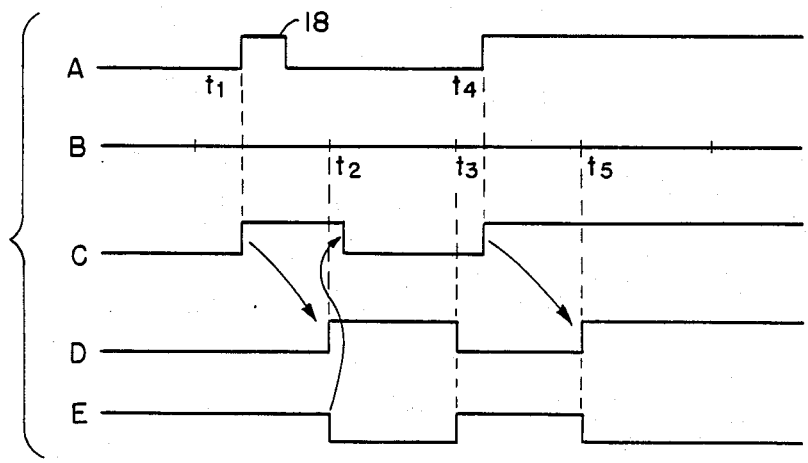
FIGS. 2A–E are timing charts for explaining the operation of the prior art glitch detection circuit of FIG. 1.

In FIGS. 2A–E the operation of the conventional glitch detection circuit of FIG. 1 is illustrated. The input signal having a glitch 18 superimposed thereon as shown in FIG. 2A is supplied at the input terminal 11. A sampling clock shown in FIG. 2B is usually not synchronous with the input data and has a smaller time period than that of the correct input signal. Since the glitch 18 is a narrow pulse, it has a smaller pulse width than the time period of the sampling clock.

When the glitch 18 is applied to the detection circuit, the flip-flop 15 is set and its Q output C is changed to high level at time $t_1$, as shown in FIG. 2C, so that the flip-flop 16 is caused to change its state with the sampling clock signal occuring immediately after $t_1$. Thus the outputs Q and $\overline{Q}$ of flip-flop 16 D,E are changed to high level and low level, respectively, at time $t_2$ as in FIGS. 2D and E. The flip-flop 15 is reset by the $\overline{Q}$ output of the flip-flop 16. Accordingly, at the next sampling time $t_3$, the output Q of the flip-flop 16 turns to low level. Next, at time $t_4$ the input data goes to high level, in response to the input signal being not a glitch but a correct data. Thus the flip-flop 15 is changed again to high level, and by the next sampling clock, at time $t_5$, the flip-flop 16 is changed in state again. The data from the output Q of the flip-flop 16 is displayed on a CRT.

Since the pulse width of the glitch 18 is smaller than the sampling clock period, and also since the time period of correct input data is greater than the sampling clock period, the glitch may be accordingly identified by the user from the waveform displayed on the screen. That is, a signal length of one sampling clock period or less is considered to be a glitch whereas each pulse width of correct data is much longer.

Although the glitch can be detected as has been described, the width of the glitch cannot be measured by this detection circuit, since all glitches are converted to signals of one sampling clock period length. For obtaining such information on a glitch, other measuring instruments such as an oscilloscope may be prepared and triggered at the position where the glitch is detected by the detection circuit, to measure the pulse width of the glitch by observing the waveform displayed on the oscilloscope. Such a measurement is complicated and time consuming, and further requires two instruments, a logic analyzer and an oscilloscope. Thus, it is very expensive.

A very narrow width of a single pulse can be measured by a conventional time interval measuring apparatus. However, when glitches are superimposed on digital data, it is impossible to measure the width of the glitches by a time interval measuring apparatus because the time interval measuring apparatus is not able to distinguish a glitch from digital data.

Figure 3:
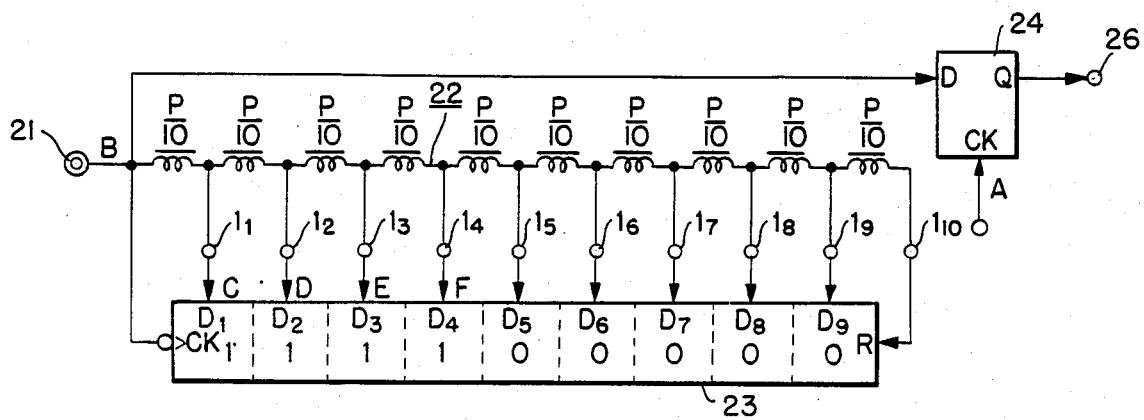
FIG. 3 is a circuit diagram showing a principal part of a glitch detecting and measuring apparatus in accordance with the present invention.

FIG. 3 shows a circuit of a principle part of the present invention. Input data from an input terminal 21 is provided to a delay means 22 which is comprised of a passive element like a coaxial cable or strip line. The delay means 22 has N output terminals each of which is delayed in succession by 1/N of the sampling clock period P.

In this example N is made to be 10 so that the delay means 22 has, for example, 10 output terminals $1_1$–$1_{10}$, and each terminal delivers a signal delayed 1/10th of the period P from the signal of the preceding terminal. The terminals $1_1$–$1_9$ are connected in this example to the data terminals $D_1$–$D_9$ of a latch circuit 23. The latch circuit 23 is comprised for example of D-type flip-flop connected in parallel form. The input data at the input terminal 21 is also provided to a clock terminal of the latch circuit 23. By the trailing edge of the input data supplied at the clock terminal, the data at each terminal, $D_1$–$D_9$ is latched in the latch circuit 23. Also, the latch circuit 23 may be reset by the signal from the terminal $1_{10}$ of the delay means 22, which is delayed by the period P from the beginning of the input data.

Since the input data at the input terminal 21 may be also used as the input data for a logic analyzer, the input data is also provided to a data terminal of a D-type flip-flop 24, and by the sampling clock supplied from a terminal 25, the Q output of the flip-flop 24 provides the sampled input data to a terminal 26.

Figure 4:
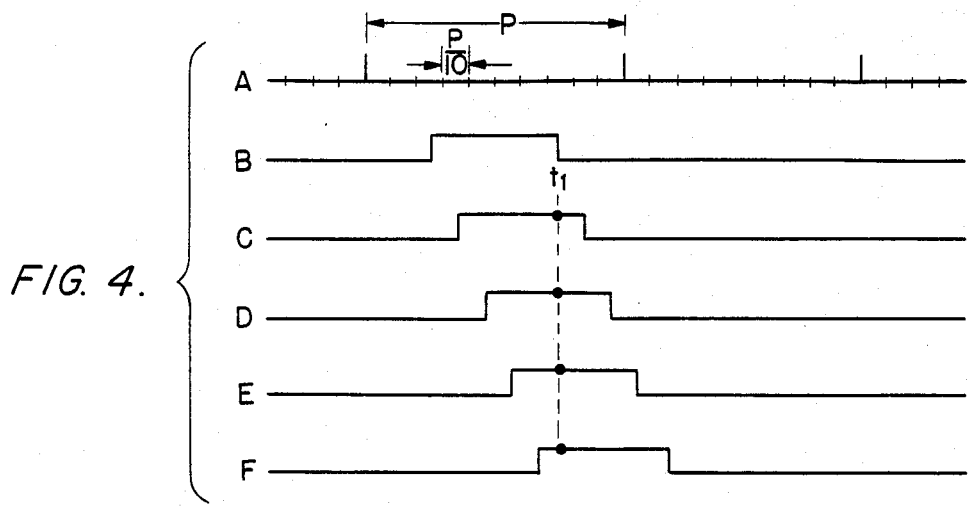
FIGS. 4A–F are timing charts illustrating the operation of the circuit of FIG. 3.

The operation of the circuit of FIG. 3 is next described in reference to FIGS. 4A–F. The sampling clock provided from the terminal 25 has a time period P as in FIG. 4A, and thus the time difference between the adjacent terminals of the delay means 22 is P/10. When a glitch as shown in FIG. 4B appears at terminal 21, the output terminals $1_1$, $1_2$, $1_3$, $1_4$ generate signals successively delayed by P/10 as shown in FIGS. 4C, D, E, F, respectively. At a time when the training edge of the glitch arrives at the clock terminal of the latch circuit 23, each data on the output terminals of the delay means 22 at that time is latched in the latch circuit 23. If the width of the glitch is less than 5P/10, then bit data from the terminals $1_1$–$1_4$ are at high level and the bit data from the other terminals are at low level. Thus the bit data 111100000 are latched at time $t_1$ in the latch circuit shown in FIG. 3.

In case the input signal provided at the input terminal 21 is not a glitch but instead is correct data, the content of the latch circuit 23 is all 1's because the period of the input data is greater than the total delay time of the delay unit 22, and thus all the signals of the output terminals $1_1-1_9$ of the delay means 22 are 1's. Accordingly, when all the data in the latch circuit 23 is 1, the input data is judged as a correct data and not a glitch. Otherwise stated, except when the data in the latch circuit is either all 1's or all 0's, the input data is recognized as a glitch and the length of the succession of the 1's or 0's is taken to be the width of the glitch. The measurement resolution can be increased by increasing the number N.

Figure 5:
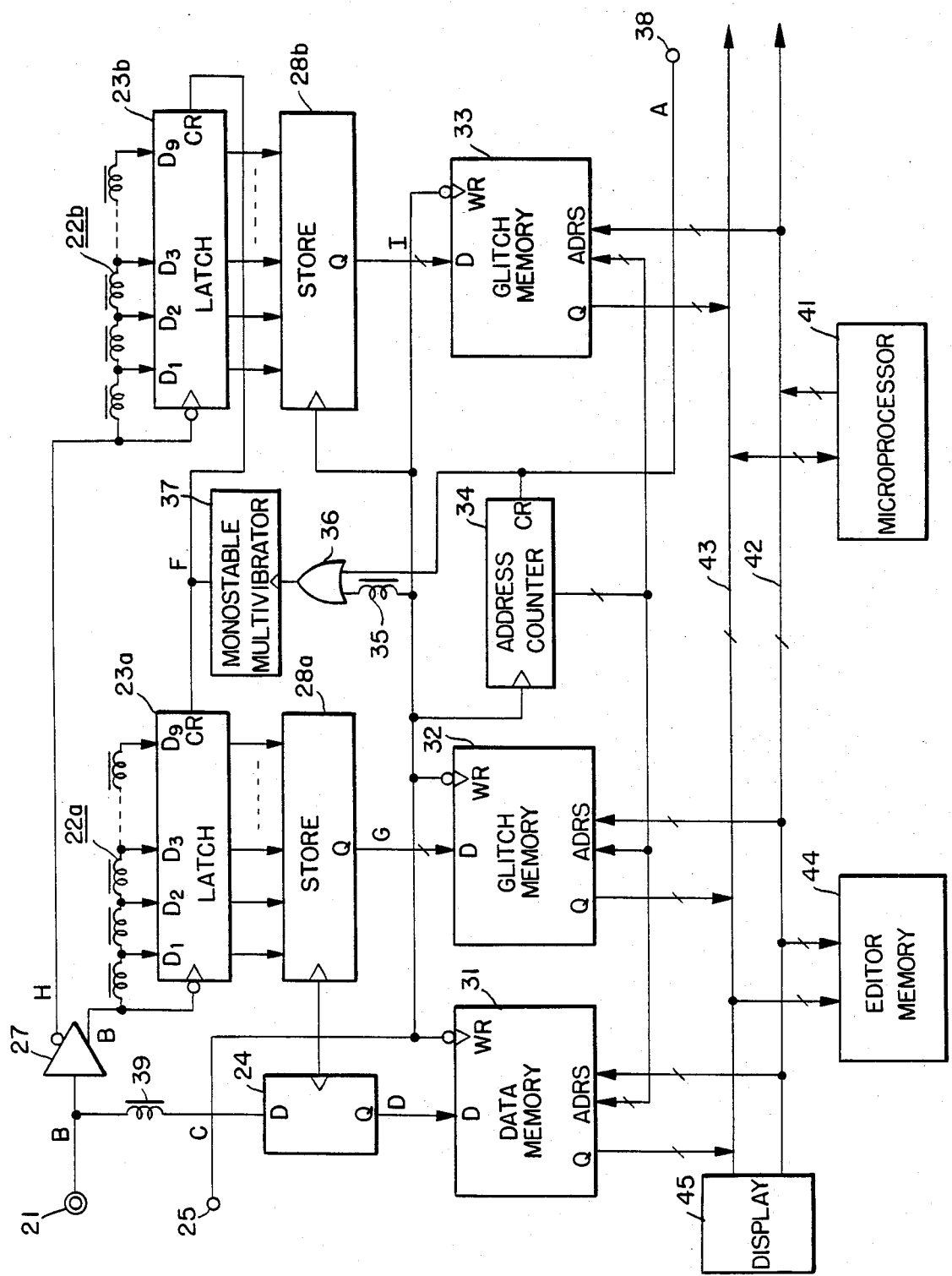
FIG. 5 shows a block diagram of the preferred embodiment of a glitch detecting and measuring apparatus in accordance with the present invention.

The preferred embodiment of the present invention is shown in FIG. 5. The input data provided at an input terminal 21 is provided non-inverted and inverted by a buffer inverter 27 to a delay means 22a and to a delay means 22b, respectively. The delay means 22a and 22b are made up essentially of the same circuit shown in FIG. 3. Thus, each delay unit is made of passive elements, has a plurality of output terminals, and, by the trailing edge of the input signal, each delayed data from the output terminals of the delay means 22a, 22b is latched in the latch circuit 23a, 23b.

The data latched in the latch circuits 23a and 23b is stored in temporary storage 28a and 28b by the sampling clock provided from a terminal 25. The input signal provided at the input terminal 21 is also provided to a D-type flip-flop 24 and is taken into the flip-flop 24 by the sampling clock. The Q output of the flip-flop 24 and each N-bit data in the temporary storage 28a and 28b are stored in indentical addresses of the data memory 31 and glitch memories 32 and 33, respectively.

For generating this address, the sampling clock is counted by an address counter 34 and the content of the address counter 34 is provided to the memories 31, 32, 33 as an address. The structure of the data memory 31 is 1 bit for one word whereas the glitch memories 32 and 33 are made of 9 bits for one word, in this example.

At the end of the write cycle of the glitch memories 32 and 33, the latch circuits 23a and 23b are reset by a reset pulse. For generating the reset pulse at the correct time, the sampling clock from the terminal 25 is provided to a monostable multivibrator 37 via a delay circuit 35 and an OR gate 36.

The address counter 34 and the latch circuits 23a and 23b are also reset by a signal from a terminal 38 at the beginning of the operation and at the time when all the required data have been written in all the addresses of the memories 31-33. A write command for the memories 31-33 is provided by the sampling clock which is supplied at read and write control terminals of each memory. For making the write timing of the data memory 31 equal to the write timing of the glitch memories 32 and 33, while sampling the input signal at the desired timing, a delay circuit 39 with the appropriate delay is provided between the input terminal 21 and the flip-flop 24.

Figure 6:
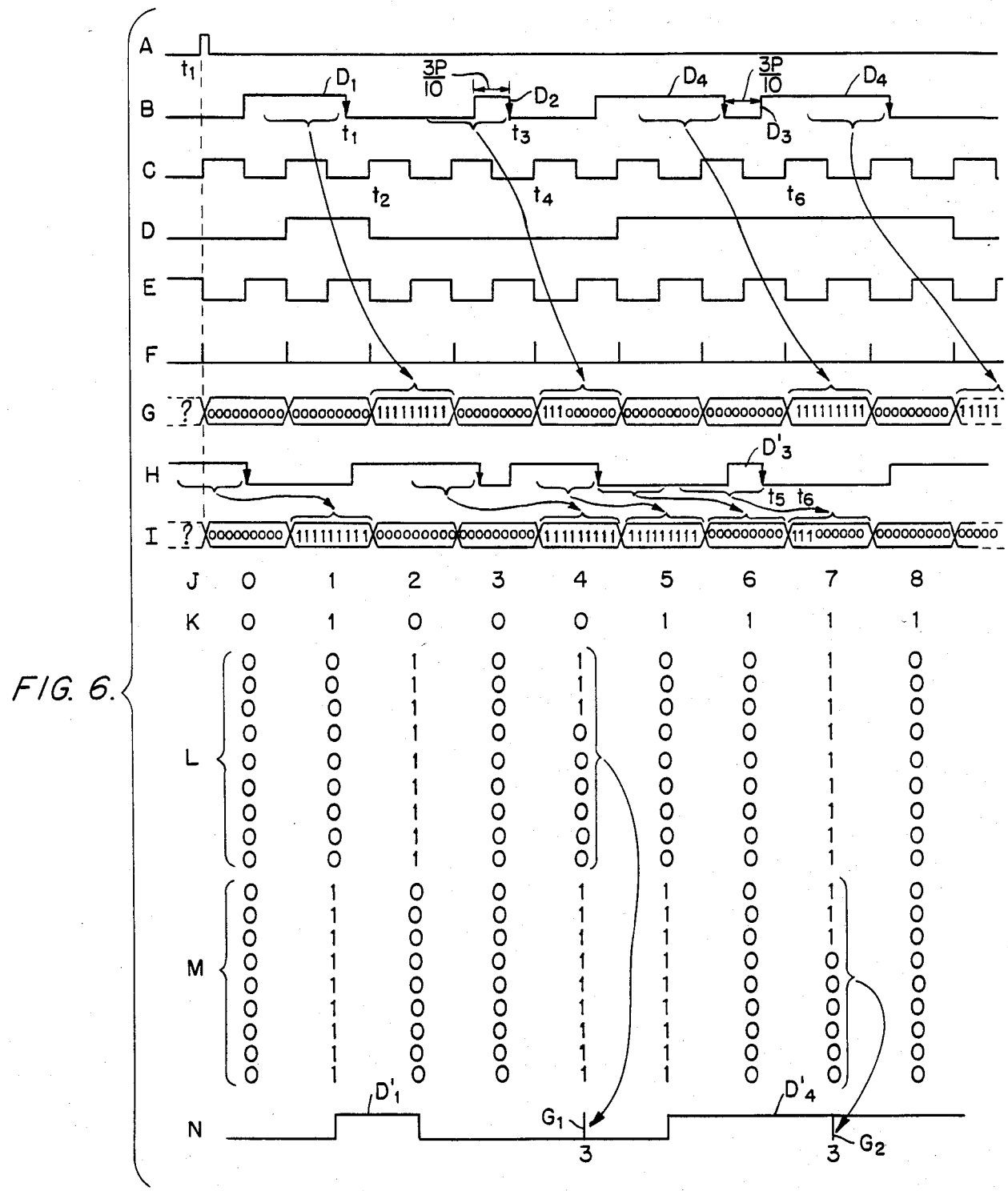
FIGS. 6A–N show waveforms and data illustrating the operation of the embodiment of FIG. 5.

FIGS. 6A-N show the operation of the embodiment of the present invention shown in FIG. 5. At time $t_1$, by an initial pulse provided at the terminal 38 as shown in FIG. 6A, the address counter 34 and the latch circuits 23a and 23b are reset. Input data as shown in FIG. 6B is supplied to the input terminal 21, and the sampling clock shown in FIG. 6C is supplied to the terminal 25. As shown in FIG. 6B, the input data is superimposed with a positive glitch $D_2$ when the signal is at low level and a negative glitch $D_3$ when the signal is at high level, thus representing all possible glitches in the context of the present invention.

The input data is read into the flip-flop 24 by the rising edge of the sampling clock, and thus the output from the flip-flop 24 becomes as shown in FIG. 6D.

As mentioned above, the latch circuits 23a and 23b are latched by every trailing edge of the input data. Namely, by the trailing edge of the correct data $D_1$ of FIG. 6B, for instance at time $t_1$, the information of the data $D_1$ is latched in the latch circuit 23a. The data bits latched in the latch circuits 23a and 23b are then transferred to the temporary storage 28a and 28b by the rising edge of the sampling clock. Thus the information on the glitch $D_1$ is latched in the latch circuit 23a by its own trailing edge and subsequently stored in the temporary storage 28a by the rising edge of the sampling clock immediately following the trailing edge of the data $D_1$, that is at time $t_2$. The data thus stored in the temporary storage 28a is shown in FIG. 6G. After the storage, the monostable multi-vibrator 37 generates reset pulses as shown in FIG. 6F, and the latch circuit 23a and 23b are reset by the reset signal.

In the same manner, the 9-bit data on the glitch $D_2$ provided from the delay means 22a is latched in the latch circuit 23a by the falling edge of the data $D_2$ at time $t_3$, and the content of the latch circuit 23a is stored in the temporary storage 28a by the rising edge of the sampling clock at time $t_4$.

The inverted input signal shown in FIG. 6H is provided to the delay means 22b from the buffer inverter 27, and the information obtained at each terminal of the delay means 22b is latched in the latch circuit 23b by the trailing edge of the inverted input signal. The data thus obtained in the latch circuit 23b is written in the temporary storage 28b by the first rising edge of the sampling clock immediately following the trailing edge of the inverted input data. The stored data in the temporary storage 28b is shown in FIG. 6I. Accordingly, the 9-bit data of the inverted glitch $D_3'$ which corresponds to the negative glitch $D_3$ is stored in the temporary storage 28b from the latch circuit 23b at time $t_6$ as shown in FIGS. 6H and 6I.

The output from the flip-flop 24 and the contents of the temporary storage 28a and 28b are stored in the memories 31, 32, 33, respectively, by the rising edge of the inverted sampling clock of FIG. 6E, according to the circuit shown in FIG. 5.

The address counter 34 generates address signals in succession, by counting the sampling clock pulse by pulse, and provides the addresses to the data memory 31 and to the glitch memories 32 and 33. In the identical addresses of the data memory 31 and the glitch memories 32,33, the data as shown in FIGS. 6K-M respectively are stored. Thus, there is one bit per word or address in the data memory 31 and 9 bits per word in each glitch memory 32,33.

After storing the data in the same addresses of the memories 31-33, the small processor (micro-CPU) 41 reads out the data from the memories 31, 32 and 33, detects the glitch according to the data and, if any, measures the width of the glitches according to the data. For instance, the process of detection and measurement of glitches for the embodiment above is carried out as illustrated in the flowchart of FIG. 7. The whole process is controlled by the micro-CPU 41. First, in step $S_1$, by a start command, the 1-bit words in the data memory 31 are transferred to the editor memory

44. In the next step $S_2$, each 9-bit word of the glitch memory 32 is read by the micro-CPU 41 which checks whether the 9 bits of each word are all 1's or not. If the 9 bits of data are not all 1's, this data is checked again in step $S_3$ as whether they are all 0's or not.

In the case of the 9 bits of the word being either all 1's or all 0's, as determined by the steps $S_2$ or $S_3$, it is determined that a glitch does not exist in this input data, and then it is checked in the in step $S_4$ whether the data that was read out is from the last address of the memory 32. On the other hand, in the case where not all the 9 bit data are 0's in the step $S_3$, the read-out data is recognized as a glitch in step $S_5$.

If the read-out data in the step $S_4$ is not the data of the last address of the glitch memory 32, the process returns to the step $S_2$ and the same process of the steps $S_2$–$S_4$ is repeated again for the next word of data from the next address of the glitch memory 32. When the last address of the glitch memory 32 is detected in the step $S_4$, the process goes to step $S_7$, wherein the data in the glitch memory 33 is read and tested.

In the steps $S_7$ and $S_8$ it is examined whether the 9 bits of each word of the glitch memory 33 are either all 1's or all 0's as described above, and if there is even one bit that is different from the other 8 bits of data, the data is considered to represent a glitch, and the number of 1's in series is counted. The counted result and polarity information of each glitch is written in the corresponding address of the editor memory 44.

After each step $S_{10}$, and the determination and storage of any existing glitch, the process goes to step $S_{11}$ wherein it is determined if the data is from the last address of the glitch memory 33 or not. If it is not the last address, the process goes back to the step $S_7$ where the data from the next address of the glitch memory 33 is read and checked. This procedure is repeated until the last address is detected, and when the last address is found, the editing of the input data and the glitch information is finished as in FIG. 7. Thus all glitches having a width of less than $9P/10$ may be automatically determined and their widths measured, since the widths up to less than this maximum width at least one of the 9 bits of data will be zero.

As has been described, both the delayed input signal, that had been converted by the sampling clock as the input data to be stored in synchronism with the sampling clock, and the glitch information, corresponding to the position superimposed on the input data including the glitch width and polarity, are stored in the editor memory 44. The data stored in the editor memory 44 are subsequently provided to the display 45, whereby the data is displayed. An example of the waveform presented on the display 45 is illustrated in FIG. 6N. The signal $D_2$ in the input data is recognized as a positive glitch and is represented by a narrow pulse $G_1$ and its width information 3 is displayed under the glitch waveform $G_1$ as shown in FIG. 6N. Also the signal $D_3$ in the input data is recognized as a negative glitch and shown by a narrow pulse $G_2$, and its width information 3 is written under the glitch waveform $G_2$ as shown in FIG. 6N. The input data $D_1$ and $D_4$ are represented by $D_1'$ and $D_4'$ respectively on the display 45. As has been described, the glitches superimposed on the correct input data is detected and its width is measured, and both the correct input data and the glitch information are represented simultaneously on the display according to this invention.

Figure 8:
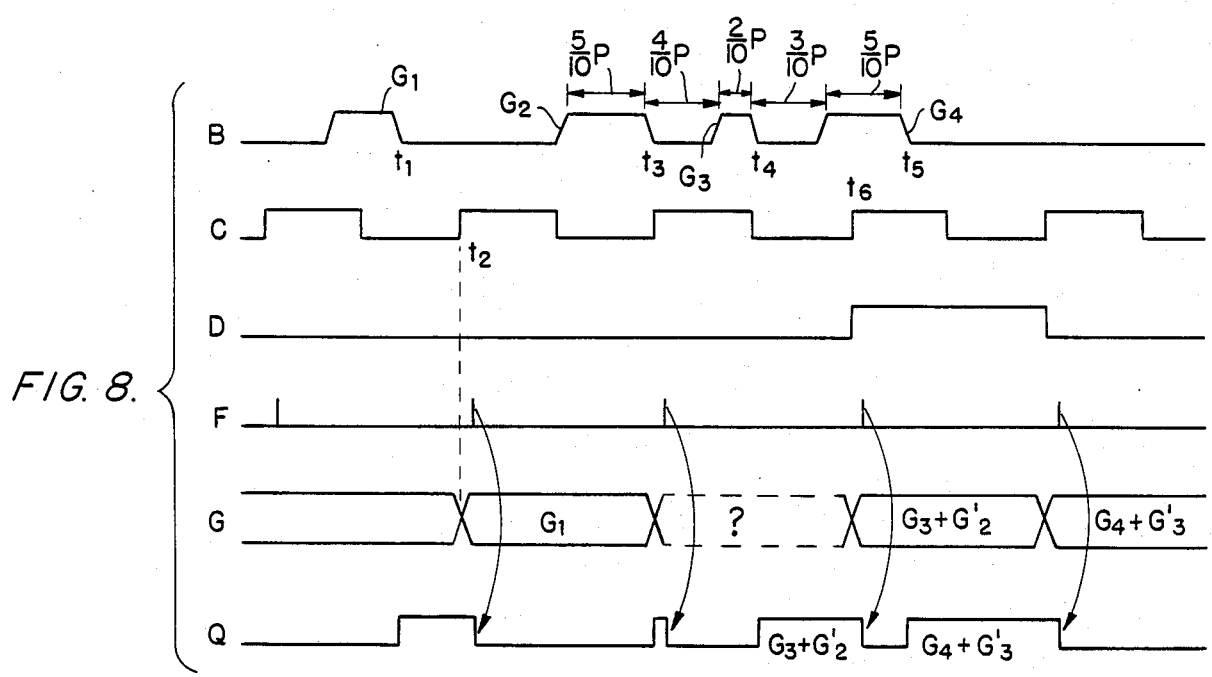
FIGS. 8B–D, F, G and Q are waveforms showing various types of glitches, and showing the relation between these glitches and the operation of the embodiment of FIG. 5.

Detection and measurement of various types of glitches in accordance with this embodiment of the present invention is as follows. For example, consider that glitches $G_1$–$G_4$ as shown in FIG. 8B are supplied to the input terminal 21. The glitch $G_1$ is the same type of glitch as discussed in FIGS. 6A–N. The trailing edge of the glitch $G_2$ has just about the same timing as the rising edge of the sampling clock. The time interval between glitches $G_2$ and $G_3$, and also the time interval between the glitches $G_3$ and $G_4$, is shorter than the sampling clock period.

At time $t_1$, by the trailing edge of the glitch $G_1$, the data corresponding to the glitch $G_1$ supplied from the delay means 22a is latched in the latch circuit 23a and the latched data is kept as it is until being reset by the reset pulse shown in FIG. 8F. By the rising edge of the sampling clock the latched data is stored in the temporary storage 28a at time $t_2$.

As to the glitch $G_2$, the obtained data is different whether the falling edge of the glitch $G_2$ at time $t_3$ comes before the rising edge of the sampling clock or after the rising edge of the sampling clock. In case the falling edge of the glitch $G_2$ comes just prior to the rising edge of the sampling clock, the required data of the glitch $G_2$ is latched in the latch circuit 23 and stored in the temporary storage 28a with the rising edge of the clock. However, if the falling edge of the glitch $G_2$ occurs after the rising of the sampling clock, the data in the latch circuit is all 0's since the data from the delay means 22a is not yet latched into the temporary storage 28a. Accordingly, in this case, the data in the temporary storage 28a depends on the timing relation between the trailing edge of the input data and the rising edge of the sampling clock.

In this latter case, in which the rising edge of the sampling clock C occurs before the falling edge of the glitch $G_2$, the combined data of the glitch $G_3$ and $G_2$ is latched by the trailing edge of the glitch $G_3$, since both glitches $G_3$ and $G_2$ occur within the same sampling clock period. The combined data is stored in the temporary storage 28a by the sampling clock at time $t_6$. However, in this case, since the time period from the rising edge of the glitch $G_2$ to the falling edge of the glitch $G_3$ is longer than the total sampling time $9P/10$, a part of the data of the glitch $G_2$ is not latched in the latch circuit 28a and thus the incomplete data $G_2'$ of the glitch $G_2$ is stored along with the data of the glitch $G_3$ in the temporary storage 28a as in FIG. 8G.

Similarly, for the glitch $G_4$, by the trailing edge of the glitch $G_4$ a part of the data of the glitch $G_3$ is also latched in addition to the data of the glitch $G_4$ at time $t_5$. Thus, by the next sampling clock, the data $G_4+G_3'$ are transferred from the temporary storage 28a and stored in the glitch memory 32.

Also regarding the glitch $G_4$, there is a possibility that the glitch $G_4$ is acknowledged as a correct data since the glitch $G_4$ occurs when the sampling clock arises at time $t_6$. FIG. 8D shows an output waveform of the flip-flop 24. Since the glitch $G_4$ is at high level at time $t_6$, the high level of the glitch $G_4$ is taken into the flip-flop 24 by the sampling clock in the same way as in the case of a correct input data.

Figure 9:
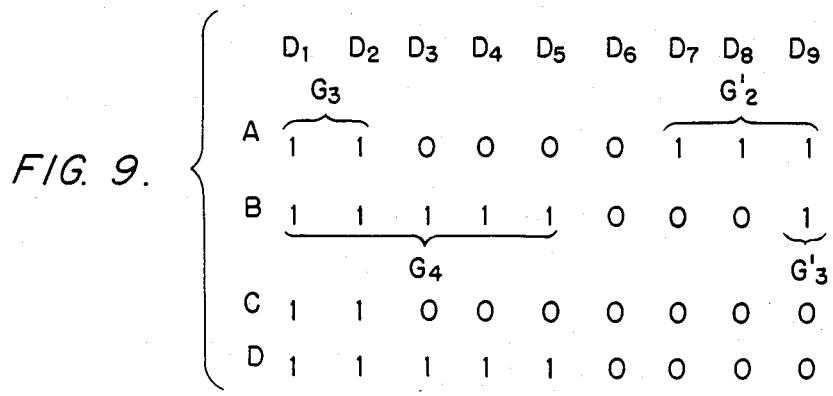
FIGS. 9A–D show the data of the glitches of FIG. 8B as stored in the embodiment of FIG. 5.

As for the data $G_3+G_2'$ and $G_4+G_3'$ of FIG. 8G and the output data of the flip-flop 24 shown in FIG. 8D, the correct information concerning the glitches may be acquired by the following process. The illustrated timings show the case in which the width of the glitch $G_2$ is $5P/10$, the time interval between the glitches $G_2$ and $G_3$ is $4P/10$, the width of the glitch $G_3$ is $2P/10$, the time interval between the glitches $G_3$ and $G_4$ is $3P/10$, and the width of the glitch $G_4$ is $5P/10$ as in FIG. 8B. The data $G_3+G_2'$ and $G_4+G_3'$, provided from the temporary storage 28a as shown in FIG. 8Q, are stored in the glitch memory 32. Accordingly, the stored 9-bit data $D_1$–$D_9$ are shown in FIGS. 9A and 9B, respectively. In FIG. 9A the data $D_1D_2$ is 11 for indicating the glitch $G_3$, the data $D_3$–$D_6$ is 0000 corresponding to the time interval between $G_3$ and $G_2$, and the data $D_7$–$D_9$ is 111 representing the data $G_2'$. Similarly the data $D_1$–$D_9$ which indicates the data $G_4+G_3'$ is 111110001 as in FIG. 9B.

Figure 10:
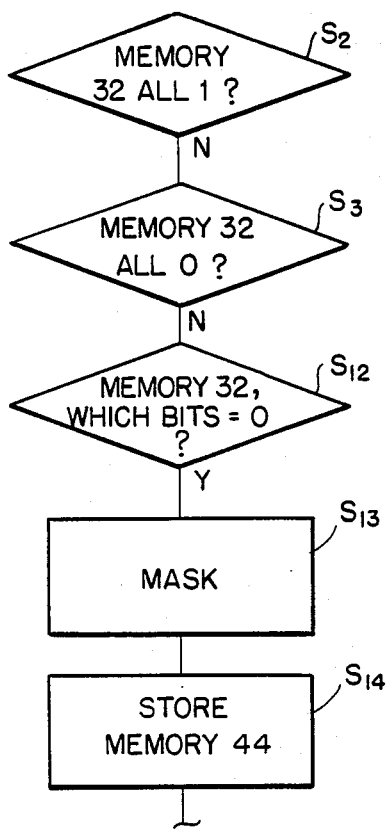
FIG. 10 is a flowchart of the operation for detecting and measuring glitches in the embodiment of FIG. 5.

A flowchart of the glitch detection and measurement by using the data of FIG. 9A or 9B is shown in FIG. 10. In step $S_2$ the one word of 9-bit data in the glitch memory 32 is checked as to whether all the bits are 1 or not. If all the bits are not 1, the word is checked as to whether all bits are 0 in step $S_3$. In the case of not all the bits being 0, the word is checked to determine which of the bits are 0's in step $S_{12}$. Then the lower order bits below the last 0 are masked and are considered to be 0's in $S_{13}$. The data $D_7$–$D_9$ of FIG. 9A and the data $D_9$ of FIG. 9B are masked accordingly, and thus the data word of FIG. 9A becomes 110000000 as in FIG. 9C, and the data word of FIG. 9B becomes 111110000 as in FIG. 9D. The data thus obtained is recognized as the glitch data of each of $G_3$ and $G_4$ in step $S_{14}$. The widths of the glitches $G_3$ and $G_4$ are measured then by counting the number of 1's in the modified data.

Figure 11:
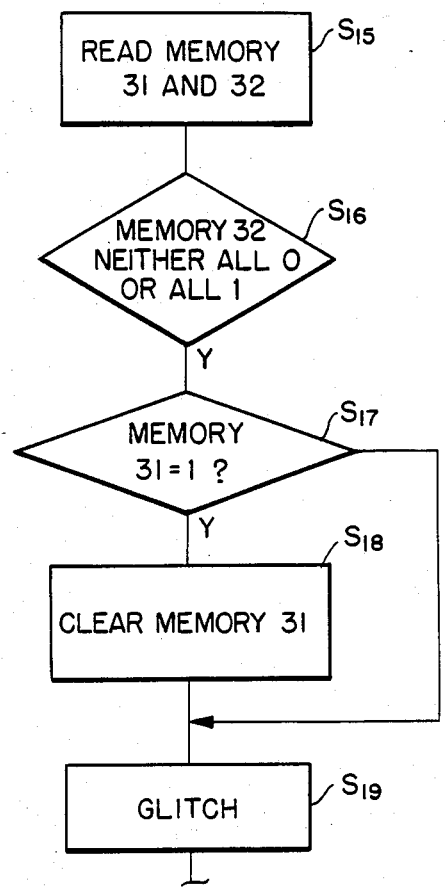
FIG. 11 is a flowchart of the operation for correcting the stored data in the data memory in case a glitch is in danger of being recognized as data.

Concerning the data shown in FIG. 8D, it is possible to eliminate this wrong data by the following process for preventing the glitch $G_4$ from being recognized as a correct data. Namely, FIG. 11 shows a process of removing such wrong data from the data memory 31. In step $S_{15}$ corresonding words in the data memory 31 (1 bit) and the glitch memory 32a (9 bits) is read out by the micro-CPU 41 and in step $S_{16}$ it is determined whether the bits of the word from each of the glitch memory 32a are neither all 1's nor all 0's. In case not all the bits of the words are either all 1's or all 0's, the content of the respective address of the data memory 31 is checked in step $S_{17}$ to see whether it is 1 or not. If it is 1, the data in the data memory 31 is cleared and made 0 in step $S_{18}$. Thus, according to the process described above, data not representing correct input data may be removed from the data memory 31.

Figure 12:
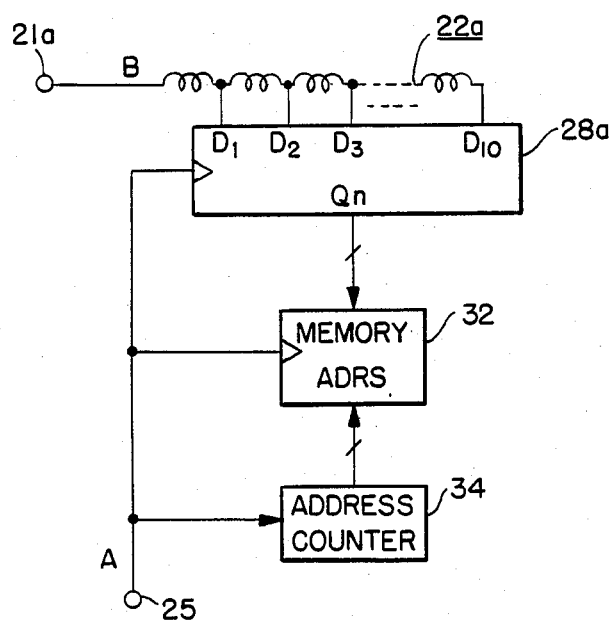
FIG. 12 shows a block diagram of another embodiment of the present invention.

It is possible to eliminate the latch circuit 23a, 23b of FIG. 5, while still obtaining the data of the glitches, also delayed for instance by multiples of 1/N of the sampling clock period as mentioned above. FIG. 12 shows a block diagram for obtaining such delayed data of a positive glitch without using the latch circuit. An input data from the terminal 21a is supplied to the delay means 22a and each data of the output terminals of the delay means 22a is directly provided to the temporary storage 28a, and is stored in it by the sampling clock provided from the terminal 25. The stored data is transferred and stored in the glitch memory 32 by the rising edge of the inverted sampling clock the same way as in the embodiment of FIG. 5. Thus, in this embodiment, each delayed data at the time of the sampling clock is stored in the glitch memory, whereas in the embodiment of FIG. 5, the data at the time of the trailing edge of the input signal is stored.

Figure 13:
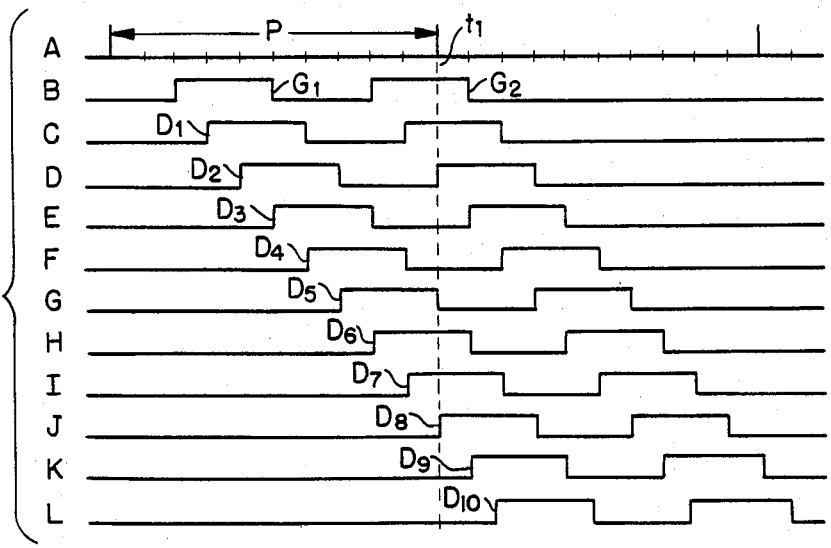
FIGS. 13A–L, 14A–L and 15A–L show waveforms explaining the operation of glitch detection and measurement in accordance with the embodiment shown in FIG. 12.

FIGS. 13A-L, show waveforms explaining the operation of the embodiment of FIG. 12. The input data contains the glitches $G_1$ and $G_2$ as shown in FIG. 13B. FIG. 13A is a waveform of the sampling clock whose time period is P. The data supplied from the delay means 22a at each data input $D_1$–$D_{10}$ of the temporary storage 28a are staggered by P/10 as shown in FIGS. 13C-L. At time $t_1$ the data of the terminal $D_1$ is 1, $D_2$ is 1 or 0, $D_3$–$D_4$ is 00, $D_5$ is 0 or 1, $D_6$–$D_7$ is 11, $D_8$ is 0 or 1 and $D_9$–$D_{10}$ is 00. All this data is stored in the temporary storage 28a by the sampling clock at time $t_1$, and subsequently this data is provided to the glitch memory 32 and stored in it. According to the 10-bit data thus obtained in the glitch memory 32, the glitch $G_1$ is detected and its width is measured as 2 or 4 in units of P/10 by a process comparable in its essential features to that of the flow diagram for the embodiment of FIG. 12, but now involving also the evaluation of bits from adjacent words in the identification of glitches and in the determination of their widths, which proceed basically as per the considerations below.

Figure 14:
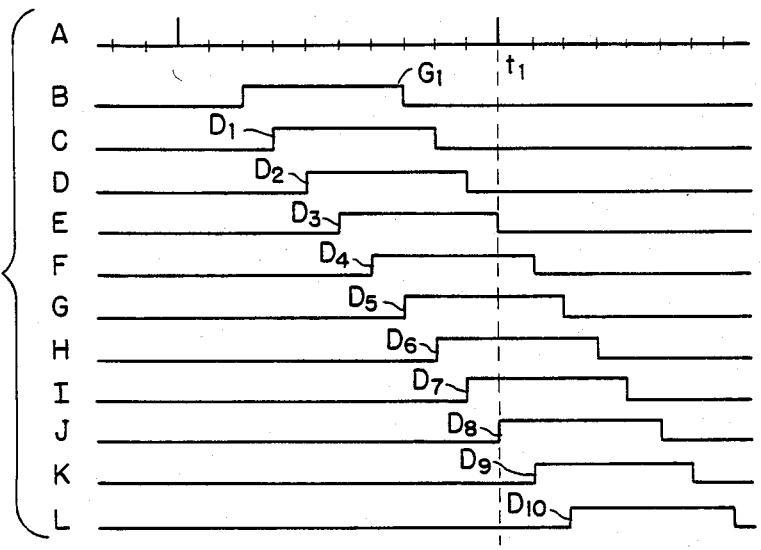

Concerning the glitch $G_1$ shown in FIG. 14B, at time $t_1$, the temporary storage 28a data are that: $D_1$–$D_2$ is 00, $D_3$ is 0 or 1, $D_4$–$D_7$ is 1111, $D_8$ is 1 or 0 and $D_9$–$D_{10}$ is 00. Thus, the width of the glitch $G_1$ is recognized as 4 or 6 of P/10 from the data.

The glitches discussed in FIGS. 13A-L and 14A-L represent a worst case with regard to the measurement accuracy for the glitch width, since these glitches are generated in synchronism with the tenths of the sampling clock period P. Thus, in the embodiment of FIG. 12, the maximum error in the measured result of the glitch width is $\pm P/10$, whereas it is $+P/10$ in the embodiment of FIG. 5, since there the glitch data is acquired by the trailing edge of the glitch itself.

Figure 15:
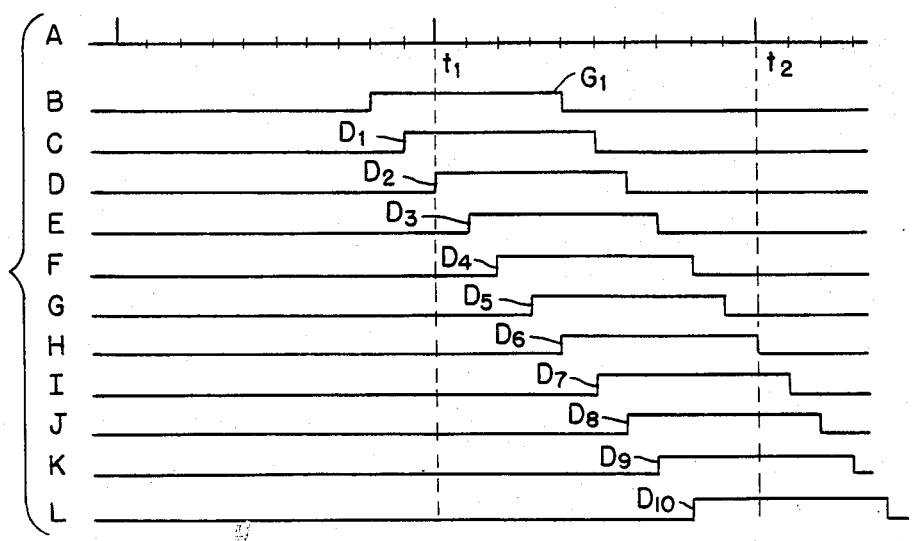

Regarding the glitch $G_1$ shown in FIG. 15B, the data on the glitch $G_1$, staggered at intervals of P/10, is taken at the times $t_1$ and $t_2$ which are separated by one clock period, and thus the data at times $t_1$ and $t_2$ are both stored in the glitch memory. Namely in this case, the information concerning the single glitch $G_1$ is stored in two successive time slots of the glitch memory. For recognizing that the data is not of two glitches but of the single glitch $G_1$, the data of the two time slots are examined by the micro-CPU 41, under the constraints of each individual case, in this particular case the data obtained at time $t_1$ beginning by 1 and being followed by 0, and the data obtained at time $t_2$ beginning by 0 and ending with 1. Thus each glitch may be identified and its length determined.

As has been described, according to the embodiment of FIG. 12, for detecting and measuring the type of glitch shown in FIG. 15B, the data of two time slots must be considered, whereas the data of only one time slot is enough in the embodiment of FIG. 5. Again, the measurement accuracy of the embodiment of FIG. 5 is seen to be higher than that of the embodiment of FIG. 12.

Figure 16:
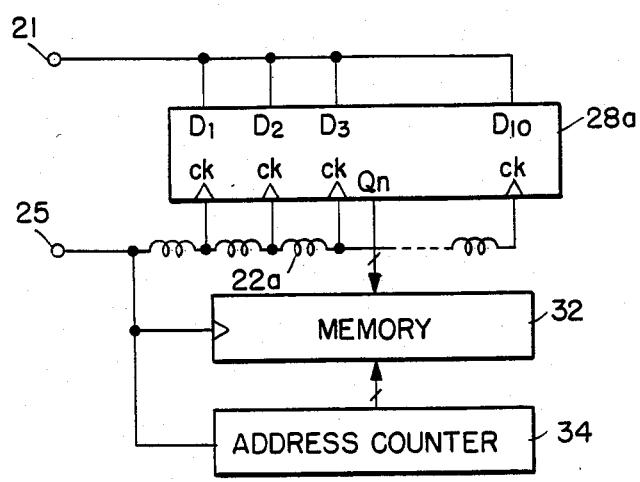
FIG. 16 shows a block diagram of a modification of the embodiment of FIG. 12, wherein the sampling clock is delayed and divided instead of the input data.

FIG. 16 shows a modified block diagram of FIG. 12. In FIG. 16, although the input data is directly supplied to the temporary storage 28a, the sampling clock is provided to the temporary storage 28a through the delay means 22a. In this case, the data stored in the temporary storage 28a is the same as the data of FIG. 12, but in the reverse direction. Thus, by storing the data from the storage 28a in the glitch memory 32 and by an analysis process comparable to those mentioned above, glitches are detected and their widths measured.

Figure 17:
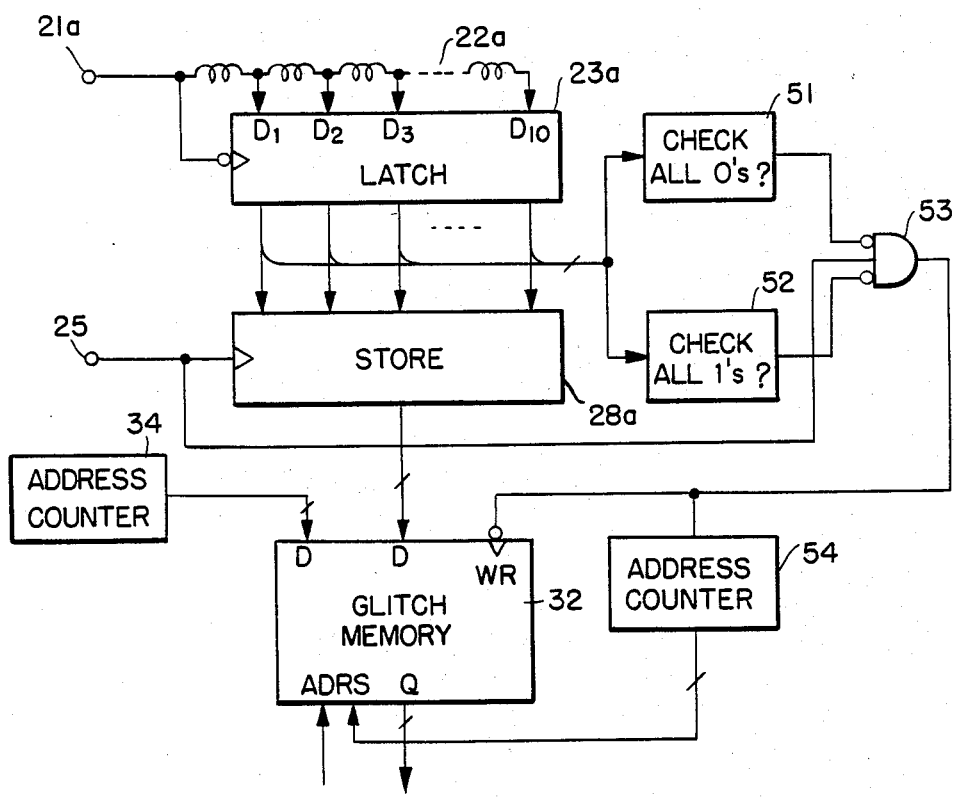
FIG. 17 shows a block diagram of another embodiment of the present invention, wherein only glitch data is stored in the glitch memory.

In the embodiment of FIG. 5, all the data acquired in the temporary storage 28a,b is stored in the glitch memories 32, 33 in respective pairs of words. It is possible to simplify the glitch detection and measurement process by not storing the data of words for which the bits are either all 1's or all 0's. FIG. 17 shows a block diagram of a glitch detection and measuring apparatus which is capable of being prevented from storing data for which a word is either all 1's or all 0's.

In FIG. 17 a check circuit 51 is provided which checks whether the 10-bit data from the latch circuit 23a are all 0's, and a check circuit 52 which checks whether the data are all 1. The inverted outputs of both check circuits 51 and 52 are connected to an AND gate 53 whose other input terminal is provided with the sampling clock from the terminal 25. Thus, in case of neither all the bits of a word being 1's nor all being 0's, the sampling clock is outputed from the AND gate 53 to an address counter 54 and the respective glitch memory 32, and thus only the contents of the temporary storage 28a and the address counter 34 which are relevant to glitch information are stored in the glitch memory. As a result, the glitch detection process is simplified, by for example eliminating the steps $S_2$ and $S_3$ in FIGS. 7 and 10. Further, it is possible to reduce the capacity of the glitch memory.

Many modifications and extensions of the present invention will be obvious to a skilled worker in the art in the light of the present disclosure.

We claim:

1. A device for detecting glitches and measuring their widths, wherein each correct data on a signal line is longer than the period of a clock signal of said device and the glitches on said signal line that are to be measured have a width that is shorter than said clock period, said glitches being limited effectively to positive glitches when the signal is at low level and negative glitches when the signal is at high level, said device comprising delay means for effectively taking N samples of the signal on said signal line spaced at an interval that is a minor part of said clock period, the width of said interval depending on the desired resolution in the measurement of the width of the glitches, and for repeating said taking of N samples of the signal on said signal line with each clock period, each said taking of N samples providing a respective N-bit word of data, store means coupled to said delay means for storing each said word of data, and computer means coupled to said store means for examining said stored words of data, for recognizing glitches therein and for determining their widths, from the values of said samples of said signal line.

2. The device of claim 1, comprising
    inverter means for inverting the signal on said signal line,
    said delay means comprising non-inverted and inverted delay means for taking said N samples of each of the non-inverted and inverted input signals, respectively, to provide respective N-bit words of data, and
    said store means comprising non-inverted and inverted store means for storing the respective N-bit words.

3. The device of claim 2, each of said N samples having a predetermined value whenever no glitch occurs during the respective clock period.

4. The device of claim 1, wherein said interval is 1/N of said clock period.

5. The device of claim 4, wherein a selected one of each said N samples is synchronized with said clock signal.

6. The device of claim 1, comprising a display unit for displaying the glitches and their widths as recognized and measured by said computer means.

7. The device of claim 1, comprising means for sampling the signal on said signal line and for storing each sample as a 1-bit data word in correspondence with each said clock pulse, and for correcting each said 1-bit data word depending on whether a glitch is determined to have occurred in the respective clock period.

8. The device of claim 1, said delay means and said store means comprising means for preventing the storage of each said N samples whenever all of the N samples are either all 1's or 0's.

9. A device for detecting glitches and measuring their widths, wherein each correct data on a signal line is longer than the period of a clock signal of said device and the glitches on said signal line to be detected have a width that is shorter than said clock period, said glitches being limited effectively to positive glitches when the signal is at low level and negative glitches when the signal is at high level, said device comprising delay and latch means for taking N samples of the signal on said signal line spaced at an interval that is a minor part of said clock period, the width of said interval depending on the desired resolution in the measurement of the width of glitches, and the value of N depending on the maximum width of the glitches to be measured, each said taking of N samples being triggered by a respective edge of the correct data and of the glitches on the signal line, each said taking of N samples providing a respective N-bit word, store means coupled to said delay and latch means, for storing each said N samples, in correspondence with the respective clock period during which they were taken, and computer means coupled to said store means for examining said samples, to identify glitches and to determine their widths from the values of said samples.

10. The device of claim 9, comprising
    inverter means for inverting said input signals, and
    said delay and latch means including non-inverted delay and latch means and inverted delay and latch means for taking said N samples of both the non-inverted input signal and the inverted input signal, respectively.

11. The device of claim 10, and store means comprising respective non-inverted store means and inverted store means respectively coupled to said non-inverted and inverted delay and latch means, for storing the respective N samples from each thereof.

12. The device of claim 10, comprising each of said non-inverted and inverted delay and latch means taking each respective N samples according to the trailing edge of the signal of both the non-inverted and inverted signals, respectively.

13. The device of claim 12, comprising
    means for sampling said signal line once every said clock period and for storing the sampled value as a signal data corresponding to each clock period, and
    said computer means including means for correcting the stored signal data according to the N samples corresponding to the same clock period.

14. The device of claim 13, comprising display means for displaying the corrected signal data as the correct data on said signal line, and the glitches that were identified with the measured widths, in correspondence within the timing of the corrected signal data.

15. The device of claim 10, the maximum uncertainty in the determination of the width of a glitch being the value of said interval.

16. The device of claim 12, the maximum uncertainty in the determination of the width of a glitch being the value of said interval.

17. The device of claim 9, said delay and latch means and said store means comprising means for preventing the storage of each said N samples whenever all of the bits of the respective N samples are either all 1's or 0's.

18. The device of claim 12, said delay and latch means and said store means comprising means for preventing the storage of each said N samples whenever all of the bits of the respective N samples are either all 1's or 0's.

* * * * *